United States Patent [19]

Dydyk

[11] 4,090,152
[45] May 16, 1978

[54] PUSH-PULL OSCILLATOR CIRCUIT WITH POWER COMBINING CAVITY

[75] Inventor: Michael Dydyk, Scottsdale, Ariz.

[73] Assignee: Motorola, Inc., Schaumburg, Ill.

[21] Appl. No.: 813,054

[22] Filed: Jul. 5, 1977

[51] Int. Cl.² .............................................. H03B 7/14
[52] U.S. Cl. ...................................... 331/102; 331/56
[58] Field of Search ............... 331/102, 101, 114, 168, 331/107 R, 56

[56] References Cited

U.S. PATENT DOCUMENTS

| | | | |
|---|---|---|---|
| 3,605,034 | 9/1971 | Rucker | 331/102 |
| 4,034,314 | 7/1977 | Dydyk | 331/101 |

*Primary Examiner*—John Kominski
*Attorney, Agent, or Firm*—M. David Shapiro

[57] ABSTRACT

A high power output push-pull microwave oscillator utilizing a plurality of tuned coaxial circuits each mounting a diode at each of two extremities and each being coupled to an output cavity of resonant frequency, $f_o$, equal to the operating frequency. An equal plurality of second cavities, also resonant at $f_o$ are coupled to bias lines one-fourth wavelength from each of the plurality of tuned coaxial circuits to reflect a short circuit across a tee junction built into the center conductor of each coaxial circuit at the resonant frequency, $f_o$, when the diodes are in a push-pull or out-of-phase operating mode. The short circuit is removed when the diodes operate in an in-phase mode and the resultant losses effectively suppress the in-phase mode of operation.

3 Claims, 10 Drawing Figures

PUSH-PULL OSCILLATOR CIRCUIT WITH POWER COMBINING CAVITY

FIELD OF THE INVENTION

The invention relates to a plural cavity high power push-pull microwave oscillator utilizing a combiner cavity for collection of output energy.

BACKGROUND OF THE INVENTION

Requirements for compact, efficient high power microwave generators have become more demanding as peripheral technical advances have forced the generators into applications which require higher power efficiency in a smaller volume. Diodes, each mounted at one extremity of each a plurality of coaxial lines, the plurality of lines being coupled to a combining cavity and sometimes to one or more stabilizing cavities are limited by the physical size of the combining cavity in terms of the number of coaxial lines which may be coupled thereto. Kurakawa's U.S. Pat. No. 3,628,171; the Harp et al, U.S. Pat. No. 3,931,587, and my U.S. Pat. No. 4,034,314, are typical of the prior art.

Hines U.S. Pat. No. 3,231,831, teaches the use of "Mode Control in Negative Resistance Devices." Kuno et al reveal "Push-Pull Operation of Transferred-Electron Oscillators," in Electronic Letters, Mar. 24, 1969, pp. 178, 179.

SUMMARY OF THE INVENTION

The oscillator of the invention as described herein overcomes some of the shortcomings and limitations of oscillators previously available in the art. Higher power is made available by reason of the use of two diodes in push-pull pair configuration in each coaxial line which is coupled to a combining cavity. A second cavity is coupled to the push-pull line by means of a transmission line which is one-fourth wavelength long. The second cavity thereby reflects a short circuit to the coaxial line at a point where a tee junction is also introduced. The result is low impedance shunting of the load when the oscillator is operating in the out-of-phase or push-pull mode allowing relatively high efficiency operation in that desired mode. When the oscillator tends to operate in the in-phase mode, the stabilizing load operates to damp the oscillation energy, thus assuring the desired push-pull mode of operation.

The combination of the invention results in higher output power due to the use of two diodes in push-pull configuration in each coaxial line circuit and in good stability in push-pull operation because of the cooperative use of the second resonant cavity and its resultant control effect on the common load.

According to one aspect of the invention, higher power is yielded from the combiner cavity because of the use of diode pairs in push-pull configuration in each coaxial tuned circuit.

According to another aspect of the invention, a stabilizing load in each coaxial circuit is used to damp out an undesired in-phase oscillation mode in each push-pull diode pair.

According to still another aspect of the invention, a resonant cavity is coupled through a one-fourth wavelength of a bias line pair used as a transmission line, to shunt a stabilizing load in a coaxial line used to mount a push-pull diode pair, thereby improving efficiency in the oscillator of the invention when the diodes oscillate in the desired push-pull or out-of-phase mode.

These and other aspects of the invention will become more apparent upon inspection of the description of the invention and the drawings.

DETAILED DESCRIPTION OF THE INVENTION

Figure 1:
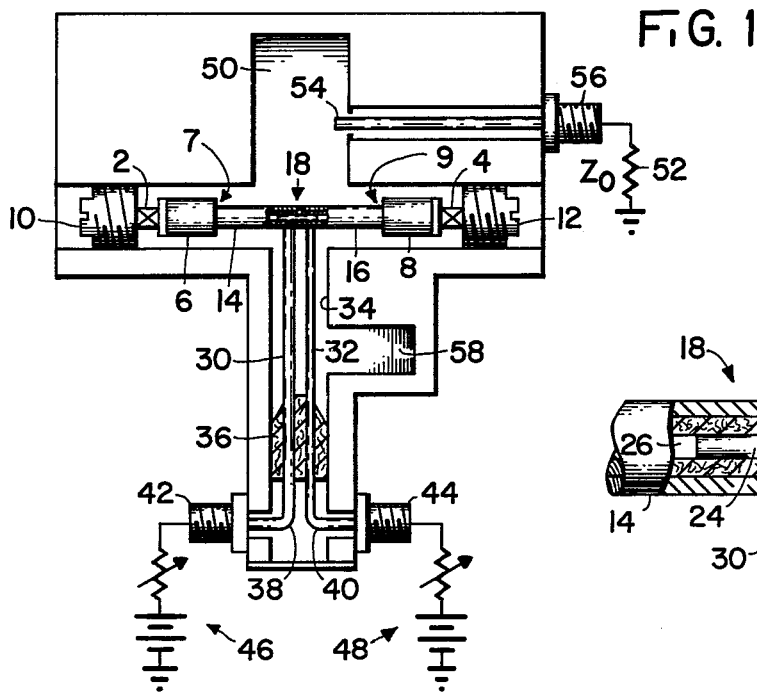
FIG. 1 is a cross-sectional view illustrative of an embodiment of the invention employing one pair of push-pull diodes.
Figure 2:
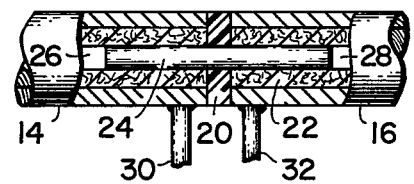
FIG. 2 shows in more detail the tee junction internal transmission line in the inner conductor of the coaxial line of FIG. 1.
Figure 7:
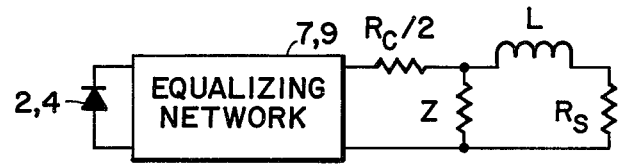
FIG. 7 is the schematic equivalent circuit of the invention of FIG. 1 when operating in the push-pull mode.
Figure 8:
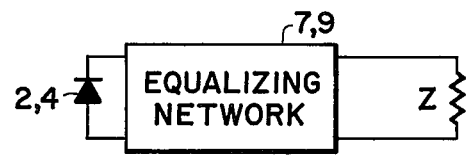
FIG. 8 is the schematic equivalent circuit of the invention of FIG. 1 when operating in the undesirable in-phase mode.
Figure 9:
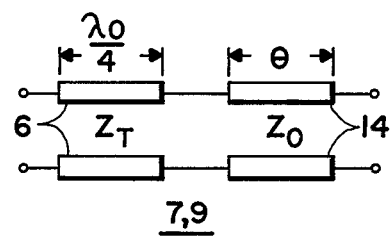
FIG. 9 is illustrative, in schematic form, of a typical equalizing network as shown in block form in FIGS. 3, 7 and 8 and in cross-section in FIG. 1.

A basic embodiment of the invention using two diodes 2, 4 is illustrated in FIG. 1. Diodes 2, 4 are mounted at the extremeties of a coaxial transmission line. Equalizing networks 7, 9 and and retaining screws 10, 12 hold diodes 2, 4 therebetween. Equalizing networks 7, 9 serve to match the impedance of diodes 2, 4 to the common load as shown in FIG. 7. Referring to FIG. 2, tee junction 18 comprises hollow center conductor line sections 14, 16 which are separated by insulator 20 which may be made of Rexolite. Absorptive material 22 surrounds inner conductor 24 within hollow inboard end portions of line sections 14, 16. Absorptive material 22 may be Emerson and Cumming, Inc. CRS-124. Line sections 14, 16 therefore make up the outer conductor of an inner transmission line whose center conductor 24 is direct current isolated from line sections 14, 16 by absorptive material 22. Insulator 20 serves to direct current isolate line sections 14, 16 from each other. It may be seen that there is no direct current path from line section 14 to line section 16. This is further assured by the existance of air gaps 26, 28 between the ends of inner conductor 24 and the end of the hollow ends of line sections 14, 16. Furthermore, absorptive material 22 has a very high d.c. resistance so that no d.c. current may flow therethrough while being highly absorptive of radio frequency energy.

At points on the outer sides of line sections 14, 16 adjacent to tee junction 18, bias conductors 30, 32 are electrically connected. (FIG. 1). Bias conductors 30, 32 extend axially through outer conductor 34 forming a transmission line perpendicular to the line formed by line sections 14, 16. This transmission line is terminated by matched load 36 made of suitable absorptive material. Bias lines 30, 32 continue through matched load 36 at 38, 40 and terminate in connectors 42, 44, respectively. Sources of direct current 46, 48 are connected to connectors 42, 44 and these currents supply the d.c. bias energy required for oscillation of diodes 2, 4. Notice that the diode currents are d.c. isolated, one from the other, by the insulating nature of tee junction 18. The two currents may, therefore, be independently controlled from external sources 46, 48, respectively. Independent biasing of diodes is required because of lack of diode 2, 4 similarity and modulator output current limitations. Microwave radio frequency energy is isolated from sources 46, 48 by matched load 36.

First resonant cavity 50, which may be cylindrical, is coupled to the diode oscillator transmission line in the vicinity of tee junction 18. Cavity 50 is resonant at the operating frequency, $f_o$, of the invention. Microwave energy from cavity 50 is coupled to external load circuit 52 by means of probe 54 and connector 56.

Second resonant cavity 58, which may be cylindrical, is coupled to the bias circuit transmission line at a point which is an odd number of one-quarter wavelengths from tee junction 18 as measured at operating frequency, $f_o$. At $f_o$, second cavity 58 presents a very high impedance to the bias circuit transmission line. One-quarter wavelength away at tee junction 18, a reflected short circuit is seen.

The operation of FIG. 1 may be more easily understood by referring to FIGS. 3–9.

Figure 3:
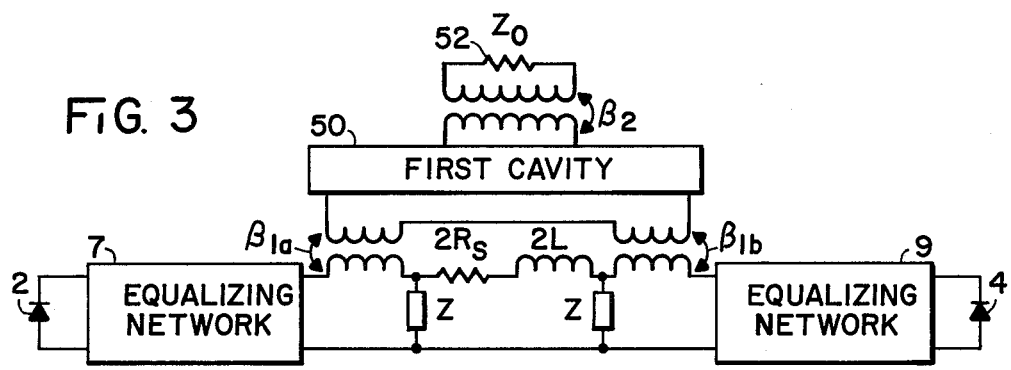
FIG. 3 is a schematic diagram equivalent electrical circuit of the embodiment of the invention illustrated in FIG. 1.
Figure 4:
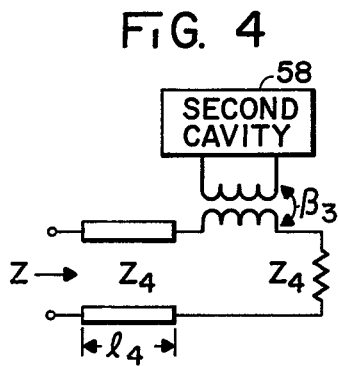
FIG. 4 is a more detailed equivalent circuit, in schematic form, of impedances, Z, of FIG. 3.

FIG. 3 illustrates an equivalent circuit of the invention of FIG. 1. Reference numerals which are identical in the various Figures refer to equivalent components of the invention. Impedances Z of FIG. 3 are shown in more detail in FIG. 4. Reference characters $\beta_{1a}$ and $\beta_{1b}$ represent the mutual coupling between first cavity 50 and line sections 14 16, respectively. Reference character $\beta_2$ represents the mutual coupling between first cavity 50 and output probe 54. Reference character $\beta_3$ represents the mutual coupling between bias lines 32, 34 and second cavity 58.

Figure 5:
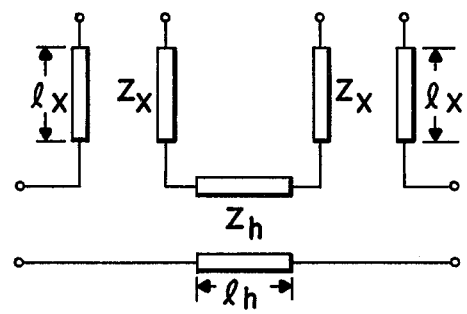
FIG. 5 is a detailed equivalent schematic circuit of the internal transmission line/tee junction of FIG. 2.
Figure 6:
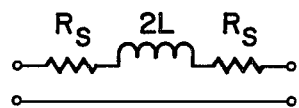
FIG. 6 is a simplified version of FIG. 5.

FIG. 5 is an equivalent diagram of tee junction 18, the internal transmission line shown in FIG. 2. It is represented by two series open circuited stubs, $Z_x$, having a length $l_x$, which are separated by high impedance line, $Z_h$ having length $l_h$. Both stubs are loaded with absorptive material 22 (see FIG. 2). By selecting the length, $l_x$, of each stub, $Z_x$, to satisfy, $\tanh(\alpha l_x) = 1$, where $\alpha$ is the attenuation constant in nepers per inch, it is possible to further simplify the circuit of FIG. 5 to that shown in FIG. 6. $R_s$ is then equal to $Z_x$ which is the characteristic impedance of the lossy stub. This representation is valid over a very wide frequency range. $R_s$ is a stabilizing load, needed to prevent diodes 2, 4 (FIG. 1) from oscillating at other than the desired frequency and (push-pull or out-of-phase) mode. Where the output of N pairs of diodes are combined in first cavity 50 (FIG. 1), as will be discussed presently, there would be at least N-1 such undesirable oscillations, all of which have essentially the same probability of occurring in the absence of stabilizing loads $R_s$.

Stabilizing loads $R_s$ also serve to restrict frequency jumping instability of the sort which is typically caused by device instability due to small changes in operating points, variations in loading conditions or even changes in environmental temperature. Loads $R_s$ also stabilize power output levels from the oscillator which may be caused by the same or similar phenomona.

The introduction of stabilizing loads $R_s$ allows stable power combination of the outputs from N pairs of diodes such as the pair shown in FIG. 1. However, if no other device were introduced, the invention would suffer from lack of efficiency due to the losses in loads $R_s$. To overcome this disadvantage, second cylindrical cavity 58 is utilized (FIG. 1). By properly locating second cavity 58 at an odd number of wavelengths from the junction of tee junction 18 and bias lines 30, 32, a short circuit is made to shunt stabilizing load 18 at the desired operating frequency, $f_o$, thereby reducing power losses which would otherwise be incurred in stabilizing load 18. The result is improved efficiency at the desired operating frequency and mode of operation while maintaining the damping effect which provides a stabilizing property at all other frequencies and modes. As the frequency changes away from $f_o$, second cavity 58 operates away from resonance where a lower impedance is coupled to bias lines 30, 32. The result is a higher shunt impedance imposed an odd quarter wavelengths away at stabilizing load 18. This allows loads $R_s$ (FIG. 3) to absorb energy and thereby damp out undesired oscillations at frequencies different from $f_o$. This means that $R_s$ may be made as large as is necessary for good off-frequency damping and stable oscillation without incurring an efficiency penalty at $f_o$.

The circuit of FIG. 3 may operate in one of two modes. Diode 2/equalizing network 7 and diode 4/equalizing network 9 may operate as out-of-phase generators in a push-pull mode or they may operate in an in-phase mode (undesired). When the two generators operate in push-pull (out-of-phase), the circuit of FIG. 2 reduces to that of FIG. 7. When the two generators operate in the in-phase mode, the circuit of FIG. 2 may be simplified to that of FIG. 8.

In FIG. 7, $R_c$ is the input impedance looking into first cavity 50 at resonance. If Z is short circuited, so are loads $R_s$, which means that no power is lost in stabilizing load $R_s$ at resonance. Since second cavity 58 is a very high Q cavity, the short across loads $R_s$ occurs only at resonance. At all other frequencies loads $R_s$ perform their stabilizing functions since they are shunted by a relatively high impedance. Upon inspection of FIGS. 7 and 8 it will be seen that there is an orthogonality of loads for the two modes of operation. It is therefore possible to select the value of Z such that at all frequencies other than the operating frequency, the in-phase mode will also be stable. Since the stability of both the push-pull (out-of-phase) and in-phase mode of operation is determined by input impedance Z outside the operating frequency, $f_o$, it is important that the variation of Z as a function of frequency be minimized. This is achieved by terminating bias transmission line 30, 32 in tapered load 36 (FIG. 1) made from, for example, CRS-124. This also serves to provide d.c./R.F. isolation.

Bias lines 30, 32, taken together, form the center conductor of a transmission line whose outer conductor 34 is common to them both. Bias lines 30, 32 are both coupled to second cavity 58. Thus, for combiner oscillators having N pairs of diodes 2, 4, it is necessary to have N second cavities, one for each pair of bias lines 30, 32.

Equalizing networks 7, 9, (see FIG. 9) may comprise a one-quarter wavelength section of coaxial line 6, $Z_t$, which is a transformer that feeds a length of line 14, having characteristic impedance, $Z_o$. The length, $\theta$, of $Z_o$ line 14 and the transformer characteristic impedance $Z_t$ are determined by a synthesis procedure requiring knowledge of diode 2 and 4 impedance, as will be well understood by one of average skill in this art.

Figure 10:
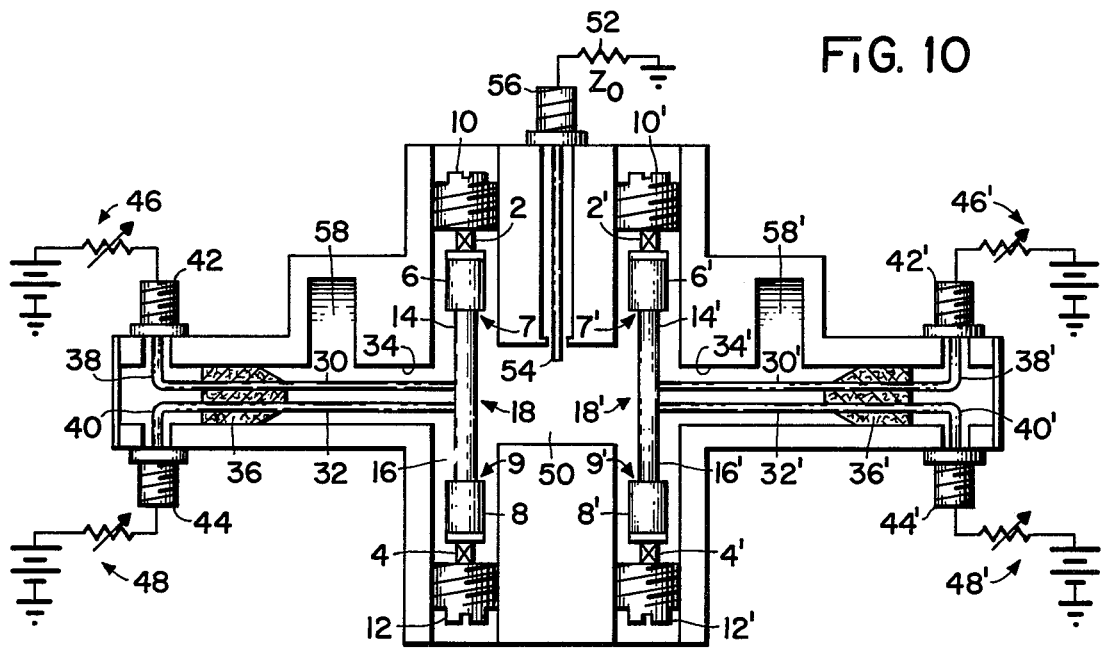
FIG. 10 is illustrative of a cross-section of an embodiment of the invention employing two coaxial oscillator circuits, each mounting a pair of push-pull diodes.

FIG. 10 illustrates how additional pairs of diodes may be added to the oscillator of the invention. FIG. 10 shows a system utilizing two pairs of diodes 2, 4, 2', 4' and two tee junctions 18, 18' coupled to single first cavity 50. Two second cavities 58, 58' are provided, each coupled to one pair of bias transmission lines, either lines 30, 32 or 30', 32'. A single output 56 is taken via probe 54 from first cavity 50. It may be seen that microwave energy from four diodes 2, 4, 2', 4' is therefore combined at output terminal 56.

Of course, cavities 50, 58 and 58' may be tuned either electronically or mechanically as will be well known to one having skill in the microwave art.

In summary, the foregoing description of my invention provides a system whereby spurious free operation of push-pull oscillators may be attained. Power efficiency may be maintained while preventing spurious or unstable operation away from the desired operating frequency or mode. The system provides a method for independent bias control of each of the diodes and also provides for efficient combining of the output energy from N pairs of diodes; N being limited only by the geometry of the first cavity with respect to the coaxial circuits which mount the diodes. Specifically, twice the number of diodes may be combined as was feasible in prior art combiner oscillators, other factors being equal.

Various other modifications and changes may be made to the present invention from the principles of the invention as described above without departing from the spirit and scope thereof, as encompassed in the accompanying claims.

What is claimed is:

1. A push-pull high power microwave oscillator comprising in combination:
   at least one coaxial transmission line, said coaxial line having a center conductor, said center conductor being of two parts and having two extremities and a direct current block, said direct current block being located between said two extremities and two parts of said center conductor of said coaxial line;
   at least one pair of diodes;
   means for mounting said at least one pair of diodes, a first of said at least one pair of diodes being mounted at a first of said two extremities of said at least one coaxial line, a second of said at least one pair of diodes being mounted at a second of said two extremities of said at least one coaxial line;
   means for applying independent direct current biases to each of said at least one pair of diodes, said bias currents being applied to said center conductors of said at least one coaxial line at points lying between each of said at least one pair of diodes and said direct current block;
   first cavity means for coupling microwave energy from each of said at least one pair of diodes, said first cavity means being coupled to said at least one coaxial line in the near vicinity of said means for applying bias, said first cavity means being resonant at a frequency of operation, $f_o$;
   second cavity means for coupling microwave energy from each of said at least one diode pair, said second cavity means being resonant at said frequency, $f_o$, said second cavity means being coupled to said means for applying bias at a point remote from said at least one coaxial line by an add number multiple of one-fourth wavelengths as measured at said frequency, $f_o$; and
   means for coupling microwave energy from said first cavity.

2. The oscillator according to claim 1 wherein said direct current block comprises an alternating current coupled transmission line within said two parts of said center conductors of said at least one coaxial line.

3. The oscillator according to claim 2 wherein said alternating current coupled transmission line within said two parts of said center conductors of said at least one coaxial line has an outer conductor which comprises hollow inner surfaces of said two parts of said center conductors, and further comprises:
   an inner conductor within and coaxial with said outer conductor;
   absorptive material being located between said outer conductor and said inner conductor, said absorptive material filling the volume therebetween; and
   insulating means for direct current isolation of said center conductors.

* * * * *